United States Patent [19]

Niwa

[11] 4,138,306
[45] Feb. 6, 1979

[54] APPARATUS FOR THE TREATMENT OF SEMICONDUCTORS

[75] Inventor: Kazuo Niwa, Yokohama, Japan

[73] Assignee: Tokyo Shibaura Electric Co., Ltd., Kawasaki, Japan

[21] Appl. No.: 828,812

[22] Filed: Aug. 29, 1977

[30] Foreign Application Priority Data

Aug. 31, 1976 [JP] Japan .................................. 51-103236
Aug. 31, 1976 [JP] Japan .................................. 51-103237

[51] Int. Cl.² ........................ B44C 1/22; C03C 15/00; C03C 25/06
[52] U.S. Cl. ..................................... 156/345; 118/49; 156/643; 156/646; 204/164; 204/192 EC; 250/531; 427/39; 427/95
[58] Field of Search ......... 204/157.1 H, 155, 192 EC, 204/164, 192 E, 298, 141.5; 427/93, 95, 38, 39; 134/22 R, 31, 1, 201; 156/345, 643, 646; 250/531; 118/48, 49, 49.1, 49.5

[56] References Cited

U.S. PATENT DOCUMENTS

| | | | |
|---|---|---|---|
| 3,924,024 | 12/1975 | Naber et al. | 427/95 |
| 4,058,638 | 11/1977 | Morton | 427/39 |
| 4,065,369 | 12/1977 | Ogawa et al. | 204/164 |

*Primary Examiner*—William A. Powell
*Attorney, Agent, or Firm*—Finnegan, Henderson, Farabow & Garrett

[57] ABSTRACT

Apparatus for the treatment of semiconductors comprises a reaction chamber for effecting the vapor phase reaction of semiconductor substrates, means for introducing a vapor phase reaction gas into the reaction chamber, a plasma generating section, means for introducing into the plasma generating section a gas suitable for the plasma treatment of the inside of the reaction chamber, microwave power applying means for activating the gas contained in the plasma generating section, conduit means for introducing the activated gas into the reaction chamber, and evacuation means, whereby the undesired deposits formed on the parts other than the semiconductor substrates can be removed easily.

8 Claims, 5 Drawing Figures

4,138,306

APPARATUS FOR THE TREATMENT OF SEMICONDUCTORS

BACKGROUND OF THE INVENTION

This invention relates to apparatus for the treatment of semiconductors and, more particularly, to apparatus for the treatment of semiconductors in which the undesired deposits formed within the reaction chamber during the vapor phase reaction of semiconductor substrates can be removed easily.

One conventional arrangement for vapor phase silicon, silicon dioxide, silicon nitride, or the like on semiconductor substrates is composed of a reaction chamber, means for heating the semiconductor substrates, and means for introducing a reaction gas into the reaction chamber. With this arrangement, the reaction material is deposited on the semiconductor substrates through the reduction or thermal decomposition of the reaction gas. However, the reaction material is not only deposited on the semiconductor substrates, but also on the heating table, the inner walls of the reaction chamber, and the like. The deposit formed on the heating table must be removed prior to the next cycle of vapor phase, because the semiconductor substrates will not be heated evenly unless the surface bearing them is flat. Moreover, the reaction material deposited on the inner walls of the reaction chamber may fall on the substrates during the reaction so as to cause abnormal growth, or may cloud the inspection window (namely, the window for looking into the reaction chamber) so as to interfere with visual inspection. In order to remove these undesired deposits, a method is available which involves heating the reaction chamber to a high temperature of about 1,000° C., and then introducing a corrosive gas such as HCl into the reaction chamber. However, since this method requires high temperatures of the order of 1,000° C., it is impossible to remove the deposits from the parts which cannot be heated to such high temperatures. Moreover, this method is not applicable to low temperature vapor phase arrangements. Furthermore, the parts which should not be exposed to HCl gas need be cleared of the deposits either by disassembling the apparatus to pickle its components or by using mechanical means to scrape off the deposit.

SUMMARY OF THE INVENTION

It is an object of this invention to provide novel apparatus for the treatment of semiconductors in which the undesired deposits formed within the reaction chamber during the vapor phase reaction of semiconductor substrates can be easily removed without any trouble.

It is another object of this invention to provide novel apparatus for the treatment of semiconductors which has improved durability.

It is still another object of this invention to provide novel apparatus for the treatment of semiconductors in which the treatment reaction may be effected at normal or elevated pressure.

In accordance with this invention, there is provided apparatus for the treatment of semiconductors comprising a reaction chamber for effecting the vapor phase reaction of semiconductor substrates, means for introducing a vapor phase reaction gas into said reaction chamber, a plasma generating section, means for introducing into said plasma generating section a gas suitable for the plasma treatment of the inside of said reaction chamber, microwave power applying means for activating the gas contained in said plasma generating section, conduit means for introducing the activated gas into said reaction chamber, and evacuation means.

BRIEF DESCRIPTION OF THE DRAWING

FIG. 2b is a sectional view of the plasma generating section of FIG. 2a; and

DETAILED DESCRIPTION OF THE PREFERRED EMBODIMENTS

The apparatus for the treatment of semiconductors provided by this invention is based on the combination of an arrangement for the vapor phase reaction of semiconductors and an arrangement for plasma treatment, whereby the deposits formed within the reaction chamber of the former arrangement can be removed by plasma etching.

One preferred embodiment of this invention is described below by reference to the accompanying drawings.

Figure 1:
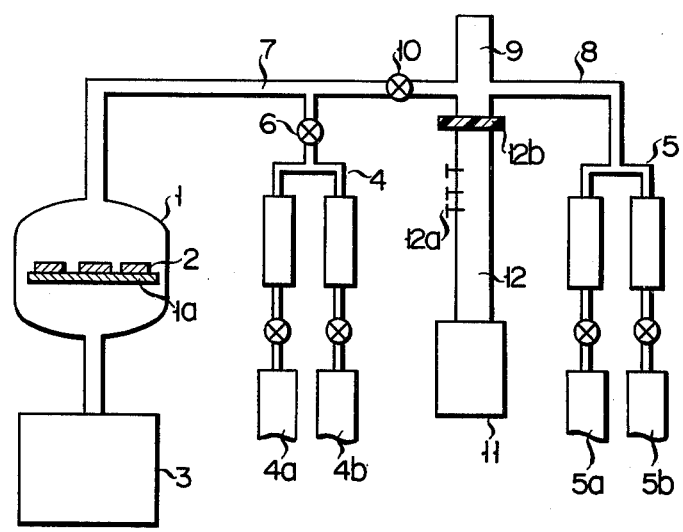
FIG. 1 is a diagrammatic representation of an apparatus for the treatment of semiconductors in accordance with one embodiment of this invention.
Figure 2A:
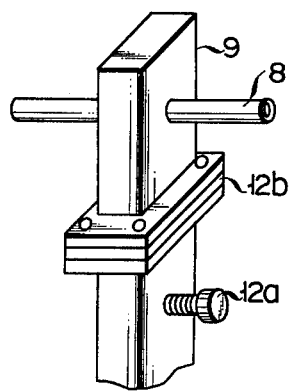
FIG. 2a is a perspective view, on an enlarged scale, of the plasma generating section of the apparatus of FIG. 1.
Figure 2B:
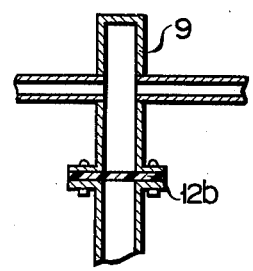

Referring first to FIG. 1, there is shown a reaction chamber 1 made of quartz, for example, in which a heating table 1a having semiconductor substrates 2 placed thereon is contained. In addition, reaction chamber 1 is connected to a vacuum device 3 for maintaining the inside of reaction chamber 1 at reduced pressure. Preferably, vacuum device 3 is a rotary type vacuum pump having a sufficient rate of evacuation and a sufficient degree of vacuum to maintain the inside of reaction chamber 1 at a high vacuum of, for example, 0.5 to 1.0 Torr. This vacuum device is used for the purposes of chemical vapor deposition (CVD) and plasma etching, both of which are carried out at reduced pressure. Further, reaction chamber 1 is also connected to a source 4 of vapor phase reaction gas which serves to effect the vapor phase reaction of semiconductor substrates 2 and to a source 5 of etching gas which serves to remove the undesired deposits formed within reaction chamber 1 during the vapor phase reaction. The source 4 of vapor phase reaction gas is composed of, for example, a source 4a of silane ($SiH_4$) gas and a source 4b of oxygen ($O_2$) gas, each of which is provided with a flowmeter. The vapor phase reaction gas fed from source 4 is introduced into reaction chamber 1 by way of a cut-off valve 6 and a conduit 7. The source 5 of etching gas is composed of, for example, a source 5a of Freon ($CF_4$) gas and a source 5b of oxygen gas, each of which is provided with a flowmeter. The etching gas consisting of a mixture Freon and oxygen is led through a conduit 8 to a plasma generating section 9, where it is activated and then introduced into reaction chamber 1 by way of a cut-off valve 10 and conduit 7. To plasma generating section 9, the microwave power originating from a microwave oscillator 11 is applied by way of a waveguide 12. This waveguide is provided with a microwave matching device 12a. Generally, plasma generating section 9 is formed by using a quartz tube extending through the end portion of waveguide 12. In such a configuration, however, the quartz tube will be excesively worn out due to plasma discharge and need be replaced whenever the number of treatment cycles reaches 300 or so. In order to overcome this disadvantage, a barrier 12b composed of a material, for example, non-conductive material such as Teflon, glass, plastics or the like, which is permeable to microwaves and impermeable to gases, may be positioned in the end portion of waveguide 12, as shown more fully in FIGS. 2a and 2b. In this case, plasma generating section 9 may be composed of a conductive material such as stainless steel, aluminum, copper or the like. Preferably, barrier 12b is composed of a material having good resistance to etching or at least the surface thereof which may come into contact with the etching gas is coated with such a material. For example, a quartz plate having a Teflon coating formed thereon may be used as barrier 12b. Preferably, at least the inner walls of plasma generating section 9 is also resistant to etching. If plasma generating section 9 is constructed in this manner, the apparatus will have improved durability and will enable one to carry out the etching treatment thereof with safety.

In the operation of the above-described apparatus for the treatment of semiconductors in accordance with this invention, semiconductor substrates 2 are placed on the heating table 1a positioned within reaction chamber 1 and the vapor phase reaction gas, such as a mixture of silane and oxygen, fed from source 4 is introduced into reaction chamber 1 with cut-off valve 6 in the open position and cut-off valve 10 in the closed position, whereby the heated semiconductor substrates 2 are subjected to vapor phase reaction. On this occasion, silicon, silicon nitride ($Si_3N_4$), silicon dioxide ($SiO_2$) and the like are undesirably deposited on heating table 1a and the side walls of reaction chamber 1. After the vapor phase reaction of semiconductor substrates 2 has been completed, the inside of reaction chamber 1 is subjected to plasma etching treatment for the purpose of removing the undesired deposits. With cut-off valve 6 in the closed position and cut-off valve 10 in the open position, an etching gas, such as a mixture of Freon and oxygen, is led from source 5 to plasma generating section 9, where it is activated by means of a microwave and then introduced into reaction chamber 1. The etching species produced in plasma generating section 9 have a very long life and accordingly enable one to remove easily the deposits formed on heating table 1a and the side walls of reaction chamber 1.

Figure 3:
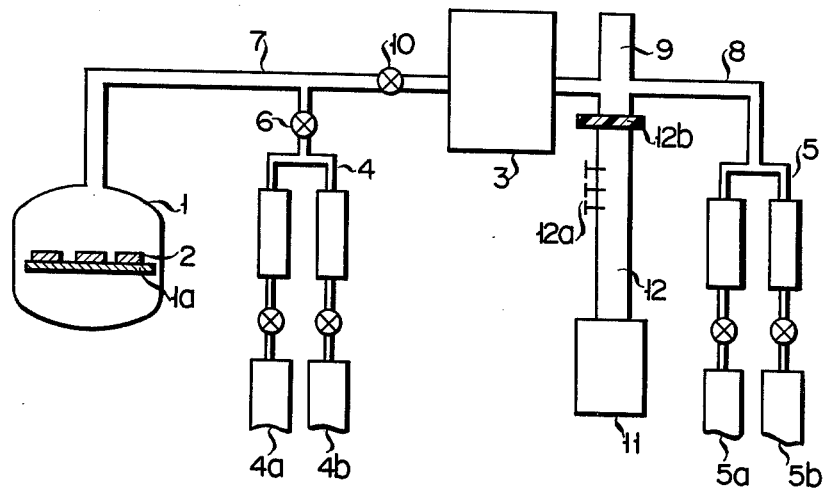
FIGS. 3 and 4 are diagrammatic representations of apparatus for the treatment of semiconductors in accordance with other embodiments of this invention.
Figure 4:
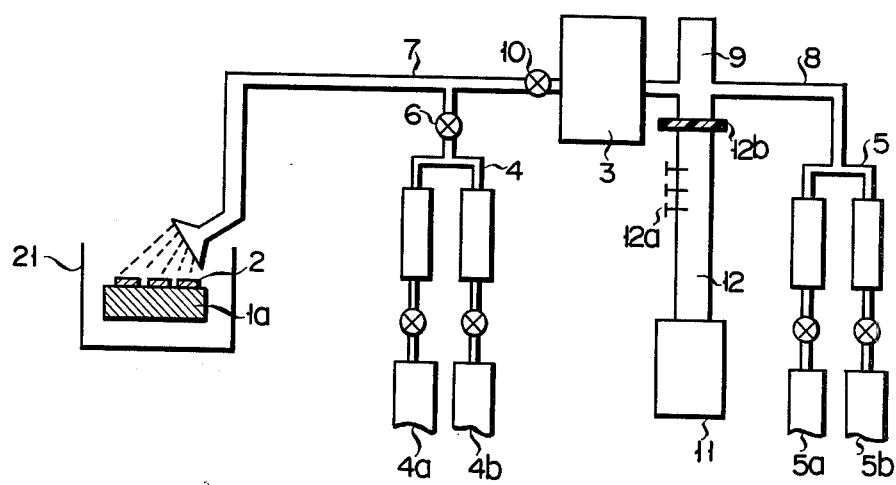

In the above-described apparatus for the treatment of semiconductors, vacuum device 3 is positioned on the outlet side of reaction chamber 1, as shown in FIG. 1. That is, the treatment reaction is effected at reduced pressure. As shown in FIG. 3, however, vacuum device 3 may be positioned on the inlet side of reaction chamber 1. In this case, the treatment reaction is effected at normal or elevated pressure. While etching treatment was possible only at reduced pressure according to the conventional plasma etching process, this invention permits etching treatment to be carried out at normal pressure simply by using a mixture of Freon and oxygen as the etching gas and a microwave as the power applying means. Thus, the apparatus for the treatment of semiconductors having vacuum device 3 positioned on the inlet side of reaction chamber 1 is suitable for the purpose of subjecting semiconductor substrates to CVD at normal pressure. In addition, it is particularly suitable for the purpose of treating samples whose properties may be changed at reduced pressure. Furthermore, in cases where CVD and etching treatment are carried out at normal pressure, a reaction chamber 21 which is open to the atmosphere as shown in FIG. 4 may be used instead of the reaction chamber which is sealed off as shown in FIG. 3.

A single example is given below in which an apparatus of this invention was used to carry out the treatment of semiconductors.

EXAMPLE

At first, sample wafers 2 were subjected to chemical vapor deposition by using an apparatus as shown in FIG. 1. More specifically, with cut-off valve 10 in the closed position and cut-off valve 6 in the open position, a mixture of silane and oxygen was let flow through reaction chamber 1 containing simple wafers 2 placed on heating table 1a, whereby a $SiO_2$ film was formed on the surfaces of sample wafers 2 to a thickness of about 1$\mu$. Heating table 1a was kept at a temperature of 500° C. On this occasion, an $SiO_2$ film was not only formed on the surfaces of sample wafers 2, but also on the exposed portion of heating table 2, the side walls of reaction chamber 1, and the like.

After sample wafers 2 were withdrawn from reaction chamber 1, cut-off valve 6 was closed and cut-off valve 10 was opened. Then, rotary pump 3 was operated to evacuate reaction chamber 1. Thereafter, a mixture of Freon 14 and oxygen was introduced into reaction chamber 1. The partial pressures of Freon 14 and oxygen were 0.3 Torr and 0.15 Torr, respectively. Subsequently, microwave oscillator 11 was actuated to apply microwave power through waveguide 12 to plasma generating section 9 and thereby start a plasma discharge within plasma generating section 9. The etching gas activated by means of the plasma discharge was led through conduit 7 to reaction chamber 1, whereby the $SiO_2$ film deposited on heating table 1a, the side walls of reaction chamber 1, and the like was etched away. When the microwave power was 1KW, the $SiO_2$ film formed within reaction chamber 1 was removed in about 10 minutes.

What is claimed is:

1. Apparatus for the treatment of semiconductors comprising a reaction chamber for effecting the vapor phase reaction of semiconductor substrates, means for introducing a vapor phase reaction gas into said reaction chamber, a plasma generating section, means for introducing into said plasma generating section a gas suitable for the plasma treatment of the inside of said reaction chamber, power applying means for activating the gas contained in said plasma generating section, conduit means for introducing the activated gas into said reaction chamber, and evacuation means.

2. Apparatus as claimed in claim 1 wherein said means for introducing a vapor phase reaction gas is connected to said conduit means by way of a cut-off valve and said conduit means is provided with another cut-off valve on the side nearer to said plasma generating section.

3. Apparatus as claimed in claim 1 wherein said power applying means is composed of a microwave oscillator and a waveguide connected thereto, and said plasma generating section is formed in the end portion of said waveguide.

4. Apparatus as claimed in claim 3 wherein said plasma generating section is formed by separating the end portion of said waveguide by a barrier which is permeable to microwaves and impermeable to gases.

5. Apparatus as claimed in claim 4 wherein said plasma generating section is composed of a conductive material selected from the group consisting of stainless steel, aluminum and copper, and said barrier is composed of a non-conductive material which is plastic.

6. Apparatus as claimed in claim 1 wherein said evacuation means is positioned on the outlet side of said reaction chamber.

7. Apparatus as claimed in claim 1 wherein said evacuation means is positioned on the inlet side of said reaction chamber.

8. Apparatus as claimed in claim 5, wherein said plastic is selected from the group consisting of polytetrafluoroethylene and glass.

* * * * *